(12) United States Patent
Van Bezooijen

(10) Patent No.: US 8,436,694 B2
(45) Date of Patent: May 7, 2013

(54) LOAD-LINE ADAPTATION

(75) Inventor: Adrianus Van Bezooijen, Molenhoek (NL)

(73) Assignee: EPCOS AG, Munich (DE)

( * ) Notice: Subject to any disclaimer, the term of this patent is extended or adjusted under 35 U.S.C. 154(b) by 1059 days.

(21) Appl. No.: 12/350,687

(22) Filed: Jan. 8, 2009

(65) Prior Publication Data

US 2009/0174496 A1    Jul. 9, 2009

Related U.S. Application Data

(63) Continuation of application No. PCT/IB2007/052697, filed on Jul. 9, 2007.

(30) Foreign Application Priority Data

Jul. 12, 2006    (EP) ..................................... 06117014

(51) Int. Cl.
*H01P 5/08*    (2006.01)
*H03H 7/38*    (2006.01)

(52) U.S. Cl.
USPC ........................................... 333/17.3; 333/32

(58) Field of Classification Search .................... 333/32, 333/17.3
See application file for complete search history.

(56) References Cited

U.S. PATENT DOCUMENTS

| | | | |
|---|---|---|---|
| 5,095,285 A * | 3/1992 | Khatibzadeh ................. | 330/306 |
| 5,629,653 A | 5/1997 | Stimson | |
| 6,414,562 B1 | 7/2002 | Bouisse et al. | |
| 6,556,416 B2 | 4/2003 | Kunihiro | |
| 6,670,864 B2 * | 12/2003 | Hyvonen et al. ................. | 333/32 |
| 6,946,847 B2 * | 9/2005 | Nishimori et al. ............ | 324/600 |
| 6,977,562 B2 | 12/2005 | Park | |
| 6,992,543 B2 * | 1/2006 | Luetzelschwab et al. ...... | 333/32 |
| 7,113,054 B2 * | 9/2006 | Riondet et al. .................. | 333/32 |

(Continued)

FOREIGN PATENT DOCUMENTS

| EP | 0 752 757 A1 | 1/1997 |
|---|---|---|
| EP | 1 401 047 A1 | 3/2004 |

(Continued)

OTHER PUBLICATIONS http://www.ifmicrowavescouldtalk.com/basics_of_impedance_inverters_for_m_wave_design_web.htm, Jan. 30, 2011.*

Leuzzi, G., et al., "Variable-Load Constant Efficiency Power Amplifier for Mobile Communications Applications," 33rd European Microwave Conference, 2003, pp. 375-377, Munich, Germany.

Van Bezooijen, A., et al., "Adaptive power amplifier concepts preserving linearity under severe mismatch conditions," IEEE Topical Workshop on Power Amplifiers for Wireless Communications, Sep. 2004, pp. 1-2.

(Continued)

*Primary Examiner* — Dean O Takaoka
*Assistant Examiner* — Alan Wong
(74) *Attorney, Agent, or Firm* — Slater & Matsil, L.L.P.

(57) ABSTRACT

According to the general concept disclosed herein, a circuit for adaptive matching of a load impedance to a predetermined load-line impedance of a load-line connected to a power amplifier output includes a fixed matching network between the power transistor and an adaptive matching network, whereby the fixed matching network acts as an impedance inverter which results in a relatively low insertion loss at high power. Results indicate that the impedance-inverting network can be used over more than a factor of 10 in impedance variation. Further, the usage of the fixed matching network, close to the power transistor, allows for the implementation of transmission zeros and/or for a well defined load impedance at a predetermined harmonic frequency, independent of the (variable) load impedance at the fundamental frequency.

20 Claims, 15 Drawing Sheets

U.S. PATENT DOCUMENTS

| | | |
|---|---|---|
| 7,199,678 B2 | 4/2007 | Matsuno |
| 2002/0140523 A1* | 10/2002 | Park et al. ............... 333/172 |
| 2005/0007194 A1 | 1/2005 | Grundlingh |
| 2005/0206472 A1 | 9/2005 | Park |
| 2006/0103466 A1 | 5/2006 | Shah et al. |

FOREIGN PATENT DOCUMENTS

| | | |
|---|---|---|
| JP | 2003-068571 A | 3/2003 |
| JP | 2006-166412 A | 6/2006 |
| WO | WO 2006/054246 A1 | 5/2006 |

OTHER PUBLICATIONS

Van Bezooijen, A., et al., "Adaptive Methods to Preserve Power Amplifier Linearity Under Antenna Mismatch Conditions," IEEE Transactions on Circuits and Systems, Oct. 2005, pp. 2101-2108, Part I, vol. 52, No. 10, IEEE.

Zverev, A. I., et al., "Handbook of Filter Synthesis," Wiley-Interscience, 1967, 9 pages, John Wiley & Sons, Inc., New York, USA.

\* cited by examiner

LOAD-LINE ADAPTATION

This application is a continuation of International Application No. PCT/IB2007/052697, filed Jul. 9, 2007, which designated the United States and was published in English, and which claims priority to European Application No. 06117014.8 filed Jul. 12, 2006, both of which applications are incorporated herein by reference.

FIELD OF THE INVENTION

The present invention relates to a circuit for adaptive matching of a load impedance to a predetermined load-line impedance of a load-line connected to a power amplifier output, and to a method of adaptive matching of a load impedance to a predetermined load-line impedance at a power amplifier output.

BACKGROUND

Commonly, power amplifiers (PA) suffer from low power efficiency at medium output power, because their load-line is typically optimized for maximum output power. Concepts of load-line switching and load-line adaptation are known. For instance, PIN-diode switched capacitors have been implemented in a BGY270 power amplifier of a transmitter for use in the GSM (Global System for Mobile communications)-system.

European patent publication 1 401 047 and U.S. Pat. No. 6,977,562 relate to "self-actuation" of RF-MEMS, wherein a variable capacitor is used in combination with a fixed matching network to set a load-line of a power amplifier adaptively. The fixed network is to be implemented with "a plurality of transmission lines," without indicating any special property of the network.

In principle, an adaptation of the load-line as a function of output power can be applied to improve power amplifier efficiency at medium power levels, as may be gathered from G. Leuzzi, C. Micheli, "Variable-load constant efficiency power amplifier for mobile communications applications," 33rd European Microwave Conference, pp. 375-377, Munich, 2003. According to theory and simulations, a single L-network gives excessive insertion loss for large impedance transformation ratios.

Moreover, network analysis reveals that the implementation of a variable inductor as a combination of a fixed inductor and variable capacitor makes insertion losses even worse. This is very undesirable, because it results in a huge PA efficiency degradation at high output power, for which a large impedance transformation ratio is typically required.

Most power amplifiers suffer from low efficiency at medium output power levels, because their load-line is optimized for maximum output power. Also most power amplifiers are often operated at medium power levels and only occasionally at maximum power. Further, for a given quality factor Q of the circuit elements, network insertion losses increase for increasing impedance transformation ratio. Consequently, losses of a variable matching network tend to become largest at maximum output power. In addition, power amplifier matching networks have to provide large rejection of harmonics, commonly realized with LC-resonance circuits tuned for these harmonic frequencies. Hence, realization of an output matching network with fixed LC-resonance circuits is in contradiction to the need of a variable LC-network for tuning the load-line at the fundamental frequency.

SUMMARY OF THE INVENTION

In one aspect, the present invention provides an adaptive load-line matching network to adapt load impedance over a wide impedance range in accordance with output power levels. Thus, energy could be saved when power amplifiers are operated at medium output power levels.

In a first embodiment, a circuit for adaptive matching of a load impedance to a predetermined load-line impedance of a load-line connected to a power amplifier output is provided. A variable impedance matching network is connected to the load impedance for transformation of the load impedance to a matched impedance. A fixed impedance inverting network is connected to the variable impedance matching network for transformation of the matched impedance to the predetermined load-line impedance. The variable impedance matching network includes at least one variable circuit element having an impedance that can be controllable by a control setting input such that matching by the variable impedance matching network is controllable by the applied control setting.

In another embodiment, a method of adaptive matching of a load impedance to a predetermined load-line impedance at a power amplifier output, is provided. A variable impedance matching network is adjusted, the network transforms the load impedance to a matched impedance. The matched impedance is inverted to a predetermined load-line impedance by a fixed impedance inverting network. The adjusting includes setting an impedance of at least one variable circuit element of the variable impedance matching network.

According to one embodiment of the circuit, the variable impedance matching network comprises two variable circuit elements, of which a first circuit element being connected in series to the load impedance and a second circuit element being connected in parallel to the load impedance.

In one embodiment the first and second variable circuit elements are variable capacitors. A variable capacitor can be implemented as an array of switchable parallel-connected capacitors. Such switchable capacitors can be realized in MEMS technology, which comprises so-called Micro-electromechanical systems (MEMS). MEMs comprise a collection of micro-sensors and actuators, such as micro switches, micro capacitors and micro inductors and so forth. The integration of MEMS into Radio Frequency (RF) circuits results in systems with superior performance levels and lower manufacturing costs. The incorporation of MEMS based fabrication technologies into micro and millimeter wave systems offers viable routes to ICs with MEMS actuators, antennas, switches and transmission lines. The resultant systems operate with an increased bandwidth and increased radiation efficiency and have considerable scope for implementation within the expanding area of wireless personal communication devices.

In a further development of the embodiment, the first variable circuit element may further comprise a variable inductor. In order to provide variability, the variable inductor may comprise, similar to the implantation of the variable capacitor, an array of switchable parallel or series connected inductors. By a series circuit of a variable inductor and the variable or fixed capacitor a variable inductor can effectively be realized, which does not require a relative high fixed inductance value. By implementation of the variable series element in the variable impedance switching network with switched inductors (or coils) and variable capacitors, a variable inductor can be attained with a high Q-factor. Thereby the trade-off between tuning range and associated insertion losses can be improved. Again, such a switchable inductor can be made controllable, similar to the variable capacitor, in MEMS technology. A respective applied control setting can be used which corresponds to a digital code stored in a corresponding "inductor"-register, the output of which "inductor"-register is connected to the implemented switched inductors such that the variable inductor is controllable by the digital code stored in the inductor register.

Hence, switchable circuit elements, such as the variable capacitors or variable inductor mentioned above, in the variable impedance matching network can be arranged controllable by external settings for the respective MEM-switches, switching respective circuit elements on and off or by respective MEM-capacitors and/or MEM-inductors which can be switched on and off. The required control setting may be implemented such that the applied setting corresponds to a digital code, which can be stored in a respective register. The output of the respective register(s) is connected to the switched circuit elements such that the variable circuit elements are controllable by the digital code stored in the respective register. If the switchable circuit elements are configured such that the single values of the parallel or series connected circuit elements are binary weighted, the digital code in the register corresponds directly to the respective set value for the respective variable circuit element such that the variable value of the circuit element can be set stepwise. Hence, the least significant bit of the binary code stored to the register will then correspond to the smallest variable step of the value of the circuit element.

According to a first aspect of the invention, the variable impedance matching network is arranged feed forward controlled by a control circuit. Therefore, the control circuit may comprise storing means, such as several registers or a memory to implement a look-up table, which comprises stored calibration data of the variable impedance matching network. The calibration data may be derived from a respective reference design circuit. Further, in the look-up table, the calibration data are mapped to several different output power levels of the power amplifier such that the optimal required setting for the variable matching network can be derived from the look-up table.

According to a second aspect of the invention, the circuit further comprises at least one detector for detecting characteristics of the matched impedance. This provides for the option of an adaptive control of the variable impedance matching network. Such adaptive control may again be implemented by a respective configured control circuit. Basically, the control circuit is to be configured to adjust the setting of the variable impedance matching network in response to the detected characteristics of the matched impedance in accordance to an actual power level of the power amplifier output.

In one embodiment of the second aspect, the control circuit comprises a look-up table, which can be realized as discussed above. In the look-up table parameter data can be stored describing the variable impedance matching network for each applied setting. Such parameter data describing the behavior of the variable impedance matching network may be at least one of S-parameter data, H-parameter data, Z-parameter data, and Y-parameter data, which are known per se and don't require a description in detail. Now, the control circuit is to be configured to calculate from the detected characteristics of the matched impedance and the corresponding parameter data of the actual setting an actual load impedance, and then to calculate from the calculated actual load impedance and the actual output power level a required new setting for the variable impedance network to achieve an optimal power transmission from the power amplifier to the load impedance.

In another embodiment of the second aspect, the control circuit for adaptive control is configured to adjust the setting of the variable impedance matching network step-by-step in response to the detected characteristics of the matched impedance of the variable impedance matching network. In a further development, the change of the setting/settings is performed in a predetermined direction until an optimum match is achieved.

Generally, the variable impedance matching network is controlled by the applied control setting such that the matched impedance is set substantially in accordance to reference impedance $R_{ref}$, which is calculated according to the equation:

$$R_{ref} = Z_0^2 \cdot \frac{2 \cdot P_{load}}{(U_{supply} - U_{sat})^2},$$

wherein $Z_0$ being the characteristic impedance of the fixed impedance inverting matching network, $P_{load}$ being the required output power, $U_{supply}$ being the supply voltage, and $U_{sat}$ being the collector saturation voltage of the power amplifier.

According to a third aspect of the invention, the fixed impedance inverting network may comprise transmission zeros. Such transmission zeros can be designed for rejection of predetermined frequencies. Further, the fixed impedance-inverting network can be designed such that it provides well-defined load impedance at a predetermined second harmonic frequency, which is independent of the load impedance at the fundamental frequency.

Good results have been achieved by circuits according to the invention implemented in a transmitter unit of a device for use, for instance, in a Wide Band Code Division Multiple Access (W-CDMA) system or a Global Communications System (GSM) according to the standard providing Enhanced Data rates for Global Evolution (EDGE).

As it regards the method of adaptive matching of a load impedance to a predetermined load-line impedance at a power amplifier output, the method provides basically the same advantages of the adaptation circuit as discussed above.

Hence, according to the first aspect of the invention, the method further comprises deriving from a look-up table a required setting for the at least one variable circuit element, wherein the look-up table comprising stored calibration data of the variable impedance matching network and the calibration data being mapped to different output power levels of the power amplifier output; and setting the impedance of the at least one variable circuit element by applying the derived setting to the at least one variable circuit element.

According to the second aspect of the invention, the method further comprises detecting at least one characteristic of the matched impedance. This enables setting the impedance of the at least one variable circuit element in response to the detected at least one characteristic of the matched impedance in accordance to an actual output power level.

Therefore, according to one embodiment, the method further comprises deriving from a look-up table, with stored parameter data describing the variable impedance matching network for each applied setting, an actual load impedance in accordance to the detected characteristics of the matched impedance and the corresponding parameter data of the actual setting; calculating from the derived actual load impedance and the actual output power level a new setting for the variable impedance network; and adjusting the setting of the impedance of the at least one variable circuit element by applying the new setting.

According to another embodiment, the method further comprises adjusting the setting of the at least one variable circuit element step-by-step in a predetermined direction, in response to the detected at least one characteristic of the matched impedance until an optimum match is achieved.

To sum it up, the general idea lies in the perception of using a fixed matching network between the power transistor and the adaptive matching network, wherein a basic property of the fixed network is to invert, alike a quarter wave transmission line, real load impedances without introducing a significant amount of reactive impedance. The use of such an impedance inverter results in a relatively low insertion loss at high power. In addition, the usage of a fixed matching network allows for the implementation of transmission zeros, for instance to reject harmonics, and/or to provide a well defined load impedance to the power amplifier at a second harmonic, for instance, to obtain inverse class-F operation, independent of the (variable) load impedance at the fundamental frequency.

The afore discussed aspects of the invention have a broad application area, in particular, where power amplifiers are operated at varying output power levels like in cellular phones, in WLAN (Wireless Local Area Network) equipment and so forth.

BRIEF DESCRIPTION OF THE DRAWINGS

Other features will become apparent from the following detailed description considered in conjunction with the accompanying drawings. It is to be understood, however, that the drawings are designed solely for purposes of illustration and not as a definition of the limits of the invention, for which reference should be made to the appended claims only. It should be further understood that the drawings are merely intended to conceptually illustrate the structures and procedures described herein. In the drawings:

DETAILED DESCRIPTION OF EMBODIMENTS

Figure 1:
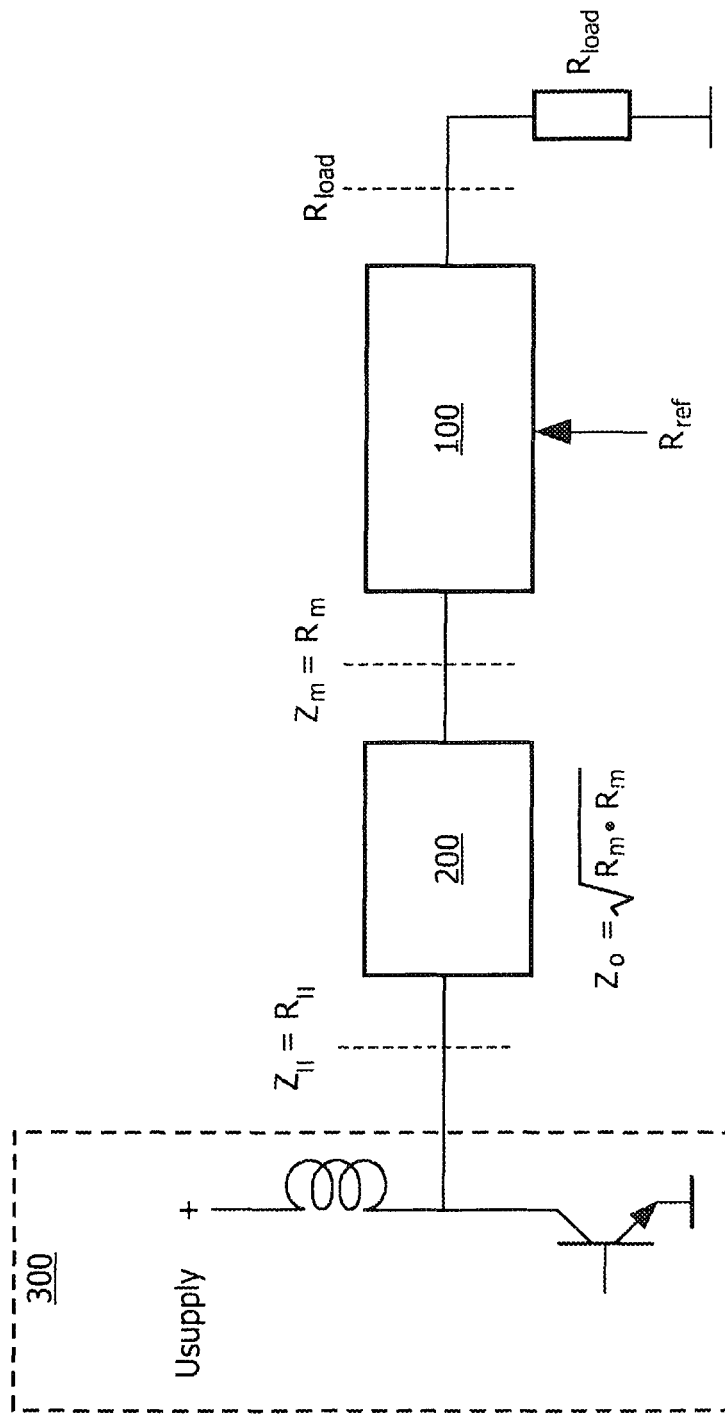
FIG. 1 illustrates the general principle of the load-line adaptation concept.

FIG. 1 shows the general concept of the adaptive load-line matching network as proposed herein is shown. First, a variable matching network 100 transforms a load impedance $R_{load}$ to a matched impedance $R_m$, wherein the matching may be arranged such that the matched impedance $R_m$ equals a reference value $R_{ref}$. Then, a fixed impedance-inverting network 200 having a characteristic impedance of $Z_0$ transforms the matched impedance $R_m$ to a load-line impedance $R_{ll}$, which is connected to the output of the power amplifier 300 symbolized by a transistor connected to $U_{supply}$.

Optimum efficiency can be obtained by setting the adaptive matching network 100 such that the matched impedance $R_m$ equals $R_{ref}$ as a function of the actual output power of the power amplifier according to the following equation:

$$R_m = R_{ref} = Z_0^2 \cdot \frac{2 \cdot P_{load}}{(U_{Supply} - U_{sat})^2}. \tag{0}$$

Thus, by the a priori knowledge on the required output power $P_{load}$, the supply voltage $U_{supply}$, the collector saturation voltage $U_{SAT}$ of the power amplifier 300, and characteristic impedance $Z_o$, the required reference value $R_{ref}$ can be determined. It is to be noted that the imaginary part of $Z_m$ should be kept at zero, while the fixed impedance-inverting network 200 preserves this reactance of zero over the entire impedance transformation range.

According to the herein disclosed concept for load-line adaptation, the setting of the variable matching network 100 can be implemented as (i) feed forward controlled load-line adaptation, or as (ii) adaptive controlled load-line adaptation.

As to the feed forward controlled system, this solution is based on complete knowledge of the variable matching network and thus does not require a mismatch detector, which will be discussed in more detail below. Hence, when a constant load impedance $R_{load}$, which may be, for example, an antenna load impedance, is assumed, the matching network may be controlled by a control circuit that uses a look-up table with extended calibration data of the variable matching network 100. In the look-up table the calibration data of the variable matching network 100 is mapped to various output power levels of the power amplifier 300.

In case of an adaptive controlled system, a mismatch detector is provided which allows for determining information on the matched impedance $R_m$, which can then be used for adjustments of the variable matching network 100 in accordance to actual required output power levels. Within the range of adaptation the adaptive controlled system can cope with mismatches of the load impedance $R_{load}$, which is an advantage over the above-mentioned feed forward controlled system.

The adaptive control can be realized with many different algorithms. Two of them are briefly discussed herein below by way of example, namely:

(a) a 1-step algorithm; and
(b) an iterative algorithm.

As it regards the 1-step algorithm, a look-table with, for example, S-parameter data for each setting of the variable matching network 100 is used. The S-parameter data may be obtained, for instance, from calibration of a reference design circuit. In electronic circuits, complex scattering parameters or S-parameters describe the scattering and reflection of traveling waves when a linear network is inserted into a transmission line. The use of S-parameters is typical but not limited to high-frequency applications, and are often measured and displayed as functions of frequency, such as a Smith chart. For each port, the applied (incident) and reflected wave is measured. When the incident wave travels through the network, its value is multiplied (i.e., its gain and phase are changed) by the scattering parameter. S-parameters completely describe the behavior of a linear device, as the variable impedance matching network 100. The individual S-parameters are dimensionless, complex numbers and are normally expressed as magnitude and phase. Depending on the application, for lower frequencies, also H-, Y-, and Z-parameters may be used to describe the variable matching network 100.

The impedance at the variable impedance matching circuit may be detected by the mismatch detector and the S-parameter data corresponding to the current setting of the variable impedance matching network 100 can be used to calculate the actual load impedance $Z_{load}$. From this calculated $Z_{load}$ and the required output power level an optimum new setting for the variable impedance matching network 100 can be calculated or determined, respectively.

Then, at a proper moment, for example, with respect to the application in a transmitter, in an idle slot or during a (time) slot boundary of the communication system, the setting of the variable impedance matching network 100 is updated. The usage of detailed a priori knowledge on the impedance transformation properties of the variable impedance matching network 100 makes the "1-step"-algorithm fast.

Alternatively, in case of the iterative adaptation algorithm much less a priori knowledge on the variable impedance matching network 100 is required. Further, as will become clear below, often a monotone control may be a sufficient to guarantee proper convergence to an optimal setting. Here, information of detected mismatch by a mismatch detector is used to slightly adjust the network in the proper direction until step-by-step an optimum match is achieved.

Now with reference to FIG. 2 an implementations of the load-line adaptation concept will be discussed by way of an example. A circuit block diagram of the proposed feed forward controlled output match, in particular, a power amplifier with fixed impedance inverting network and a feed forward controlled variable matching network is shown.

Accordingly, the variable impedance matching network 101 comprises an L-network with a series inductor $L_{series}$, a variable parallel capacitor $C_{par}$, and a variable series capacitor $C_{series}$. The variable impedance matching network 101 down-converts the load impedance $R_{load}$ in accordance to equation (0). Both variable capacitors $C_{series}$ and $C_{par}$ comprise of, for example, a 5-bit binary weighted array of switched capacitors C, 2C, 4C, 8C, and 16C, which may be implemented as RF-MEMS. The settings of the respective switched capacitors C, 2C, 4C, 8C, and 16C are determined by a digital code stored in a register 120, which can be set by a respective input SET. For instance, a 3-wire bus (I2C) can be used to interface with a controller circuit, for example, a base-band controller of a transmitter, to set the register. A level shifter 110 converts the output voltage of the register 120, which is typically around 3 V, to a much higher control voltage for the switchable capacitors, such as 30 V that is required to switch an electrostatic RF-MEMS device.

The fixed impedance-inverting network 201 consists of two L-networks that act as an impedance inverter with characteristic impedance $Z_0$, for example, the value of $Z_0$ as it regards for the current example around 8Ω. The series resonant circuits, in the embodiment, in each parallel branch are configured to reject frequency components $2f_0$ and $3f_0$ at the second and third harmonic. A DC-supply is applied at the center node of fixed impedance inverting network 201 thus its impedance can be maintained relatively low (approx. 8Ω) over the entire range of the load-line impedance adaptation. Further, in the example, the DC-supply is made parallel resonant to achieve sufficient isolation to the supply for a relatively small size inductor.

Figure 2:
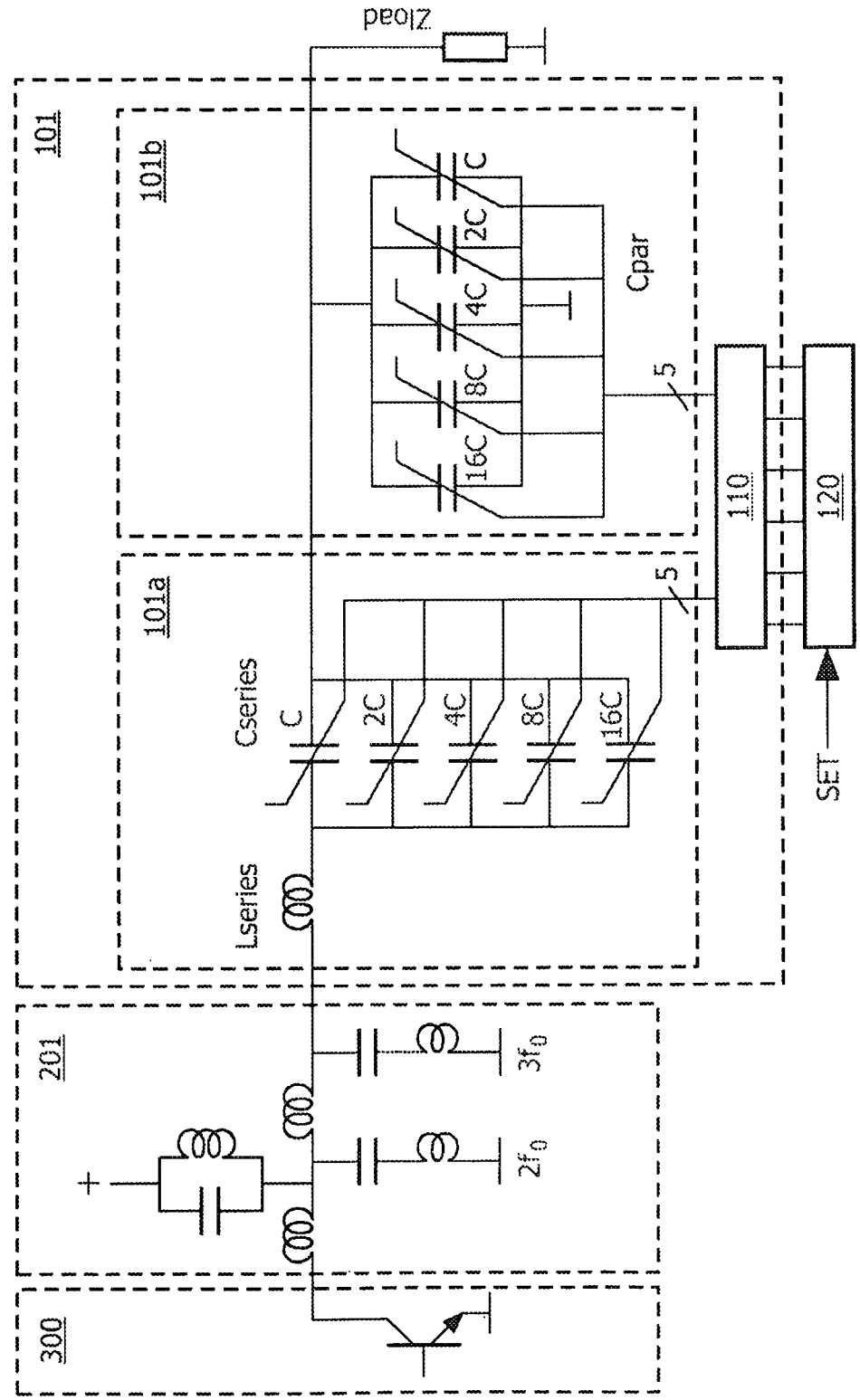
FIG. 2 shows a circuit diagram of an embodiment of a power amplifier with fixed impedance inverting network and a feed forward controlled variable matching network.

That is in FIG. 2, the fixed impedance inverting network 201 can be implemented, with lumped elements to save space, such as a double-L network with series-LC traps at $2f_0$ and $3f_0$ providing rejection of specific frequencies, for instance harmonic rejection. The adaptive part of the whole network, the variable impedance matching network 101 is an impedance down-converting single-L network, of which series branch 101a consists of the inductor $L_{series}$ and the variable capacitor $C_{series}$, whereas the shunt branch 101b consists of the variable capacitor $C_{par}$. Both capacitors $C_{series}$ and $C_{par}$ are implemented, as binary weighted switched capacitor arrays, in RF-MEMS technology.

Figure 3:
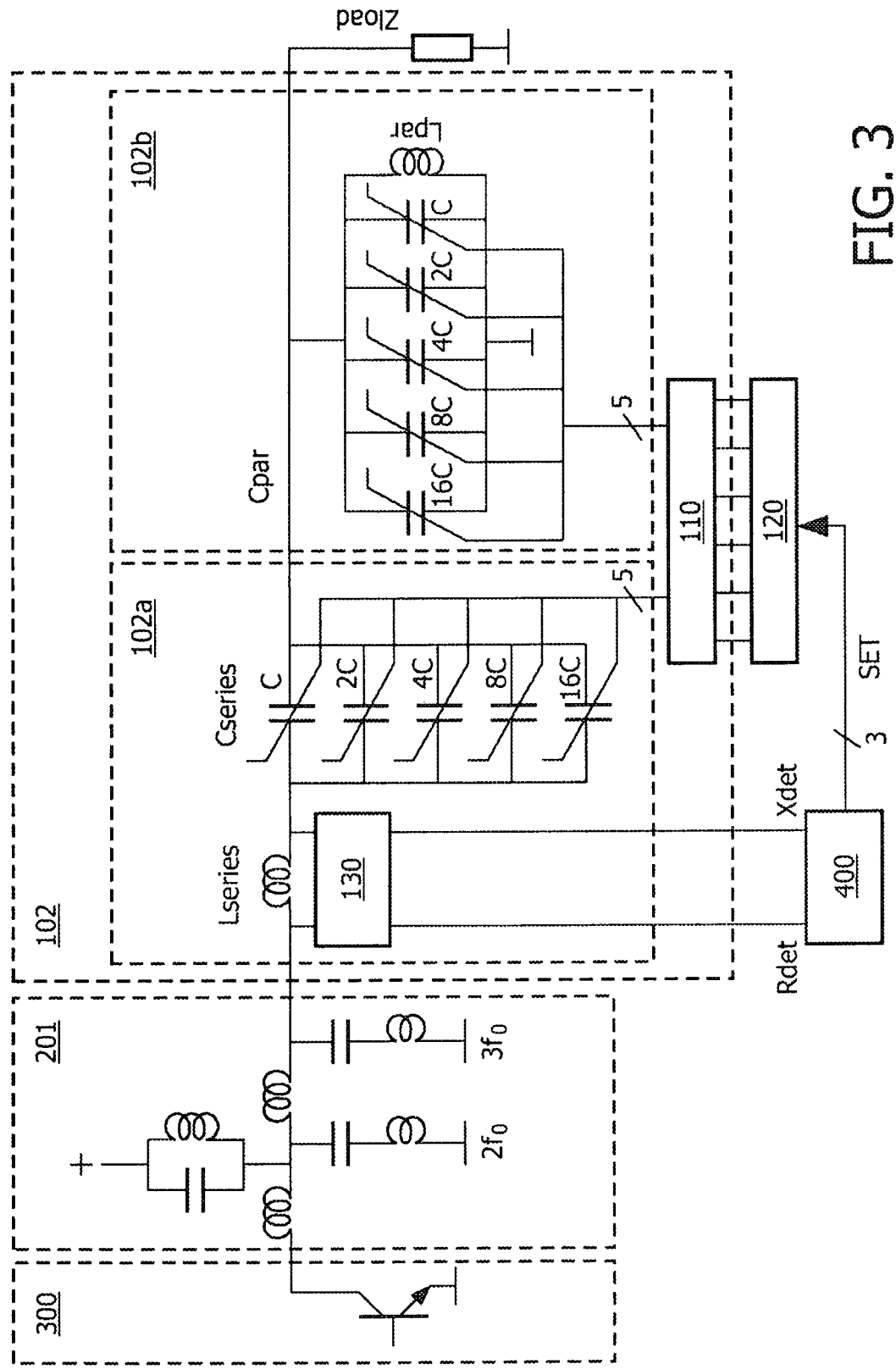
FIG. 3 shows a circuit diagram of an embodiment of a power amplifier with adaptive controlled variable impedance matching network.

Now reference is made to FIG. 3, which shows a power amplifier 300 with fixed impedance inverting network 201 and adaptive controlled variable matching network 102, wherein the adaptive load-line is controlled based on a 1-step algorithm according to one certain embodiment of the invention. The circuit in FIG. 3 comprises a similar variable impedance matching network 102 and fixed impedance inverting network 201 as the feed forward controlled concept in FIG. 2.

However, there is an additional inductor (coil) $L_{par}$ that is connected in parallel to the switchable capacitor $C_{par}$ of the shunt branch 102b of the variable impedance matching network 102. This allows also for adaptive tuning of capacitive loads $Z_{load}$. Further, functionality is broadened. Furthermore, there is in addition to FIG. 2, a mismatch or impedance, respectively, detector 130 to measure the matched impedance $R_m$ at the location in between the two networks 102 and 201. In this embodiment, the inductor $L_{series}$ series branch 102a is used as sensing element of the impedance detector 130. The impedance detector 130 outputs $R_{det}$ and $X_{det}$ are passed over to a control circuit, for example, a controller 400, to determine a new applicable value SET to be down loaded in to the register 120. In case of the FIG. 2, there is no impedance detector 130 and therefore, the optimum setting of the capacitors $C_{par}$ and $C_{series}$ assumes a nominal load impedance of $Z_{load}$, for example, 50Ω.

Figure 4:
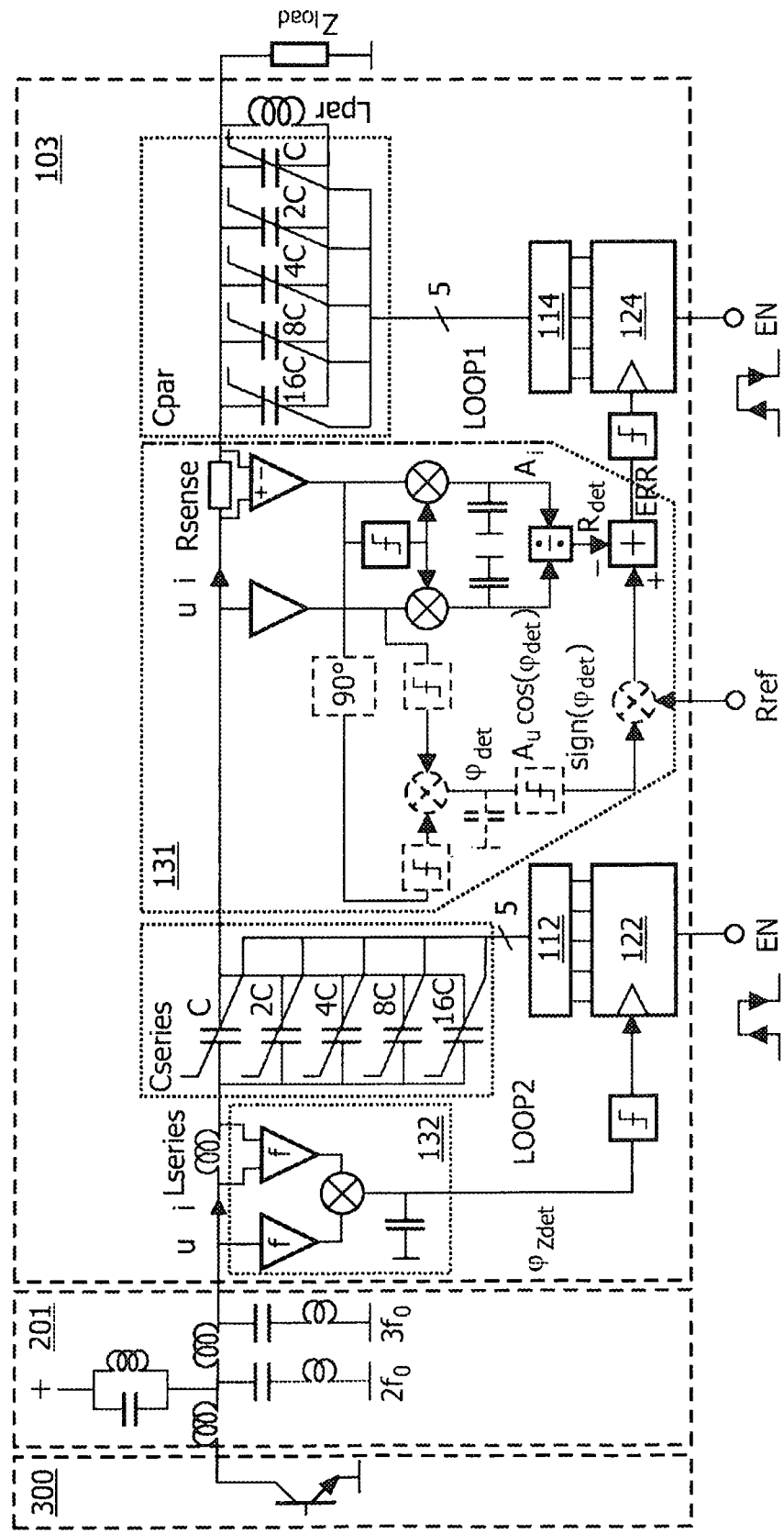
FIG. 4 shows a circuit diagram of an embodiment of a power amplifier with, self-contained, iterative adaptive controlled variable impedance matching network.

Now reference is made to FIG. 4, in which a circuit block diagram of a proposed adaptive load-line impedance adaptation is shown, based on an iterative adaptation algorithm. The circuit diagram is an embodiment of a self-contained iterative load-line adaptation.

A quadrature detector 131 determines the real part of the detected impedance $R_{det}$ with a sensing resistor $R_{sense}$. This detected series impedance $R_{det}$ is compared to a reference value $R_{ref}$, which is determined according to equation (0), above and applied to a circuit by a respective control circuit (not shown). The sign of the error signal ERR sets the counter 124 to either count up or down, thereby minimizing the error signal, by respectively setting via the register/level-shifter 114 the switches of the parallel capacitor $C_{par}$ consisting of the binary weighted capacitors with the values 16C, 8C, 4C, 2C, and C. Again, in order to allow for adaptive tuning of capacitive loads $Z_{load}$, there is the additional inductor (coil) $L_{par}$ which is connected in parallel to the switchable capacitor $C_{par}$ of the variable impedance matching network 103.

The series capacitor $C_{series}$ is controlled by a phase detector 132, sensing the phase difference between the node voltage u and branch current i on the left-hand side of $L_{series}$. The sign of the detected phase sets, in a similar manner as with the counter 124 above, the mode of the up/down counter 122 to set the value of the series capacitor $C_{series}$ via the register/level shifter 112.

By the adaptive loops LOOP1 and LOOP2 adjusting in a self-contained manner the variable circuit elements $C_{par}$ and $C_{series}$ of the variable impedance matching network, a real load impedance $R_{load}=\text{Re}(Z_{load})$ can be provided to the fixed impedance inverting network 201. As a result, within the adaptation range of both loops LOOP1 and LOOP2 it can be achieved that the load-line impedance is effectively independent of the actual load impedance $Z_{load}$.

It is noted, that for the determination of the reference value $R_{ref}$ different methods can be used, for instance, the above-discussed equation (0) can be used to calculate the reference value $R_{ref}$ with respect to an optimum in efficiency. That is to say, equation (0) is one alternative approach for determining the reference value $R_{ref}$ but it is not intended to restrict the present concept thereto.

Further, a calibration of the reference value $R_{ref}$ for optimum efficiency and/or linearity at various output power levels and operating frequencies may be performed after PAM/phone manufacturing. Typically, the higher $R_{ll}$ is chosen the better the efficiency will be, but once saturation occurs distortion may become worse. Therefore, there is, for linear systems like GSM EDGE and W-CDMA, a trade-off to be made between efficiency and linearity.

Furthermore, detection of the minimum collector peak voltage can be used to adjust the reference value $R_{ref}$, as illustrated in A. van Bezooijen, R. Mahmoudi, A. H. M. van Roermund, "Adaptive power amplifier concepts preserving linearity under severe mismatch conditions," IEEE Topical Workshop on Power Amplifiers for wireless communications, September 2004 or in A. van Bezooijen, R. Mahmoudi, A. H. M. van Roermund, "Adaptive methods to preserve power amplifier linearity under antenna mismatch conditions," IEEE Transactions on circuits and systems part-1, vol. 52, nr 10, pp. 2101-2108, October 2005. Thereby a full adaptive control of the load-line can be achieved.

Figure 5A:
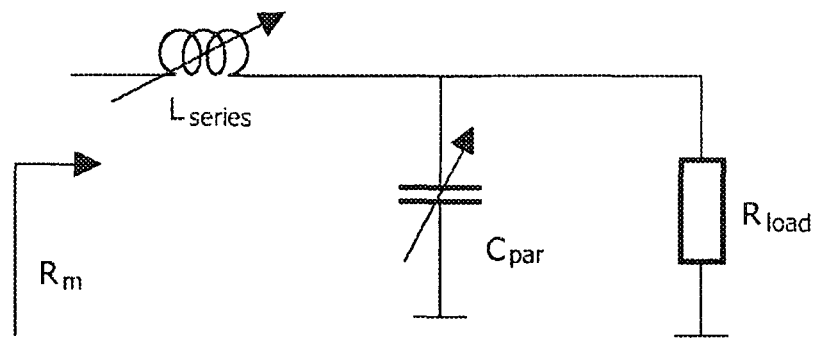
FIGS. 5a-5e illustrate network properties of a first implementation of the variable impedance matching network.

In the following more information on the network properties will be discussed to support a better understanding of the concept presented herein. Firstly, with respect to the variable impedance matching network, a variable L-network with a tuneable series inductor will be analyzed as depicted by the schematic circuit diagram in FIG. 5a. In particular, a mathematical analysis on the possible impedance adaptation range, maximum-to-minimum capacitor ratio and insertion loss of the single L-network will be given in the following. Hence, an in-sight on the trade off between these parameters will be provided. With respect to more detailed information reference is made to the "Handbook of filter synthesis", Anatol I. Zverev, John Wiley and Sons, Inc., New York, U.S.A., 1967.

Figure 5B:
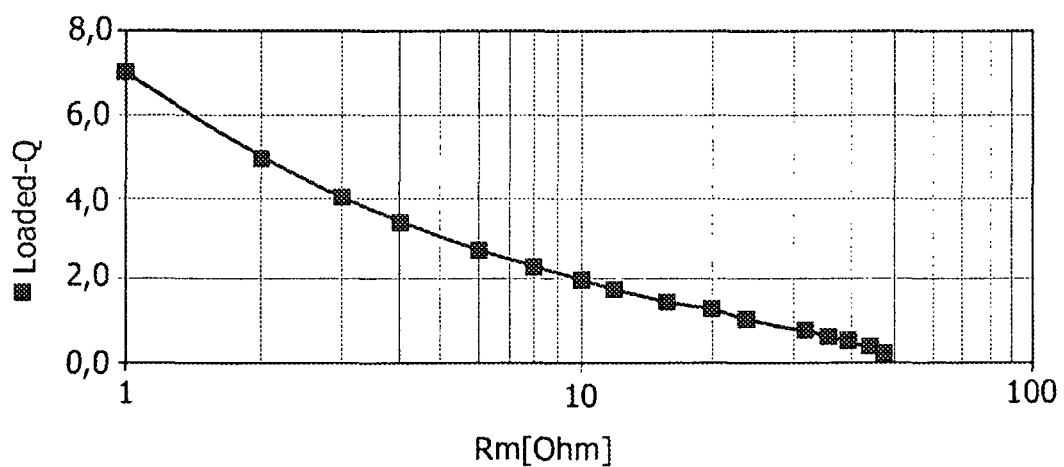
Figure 5C:
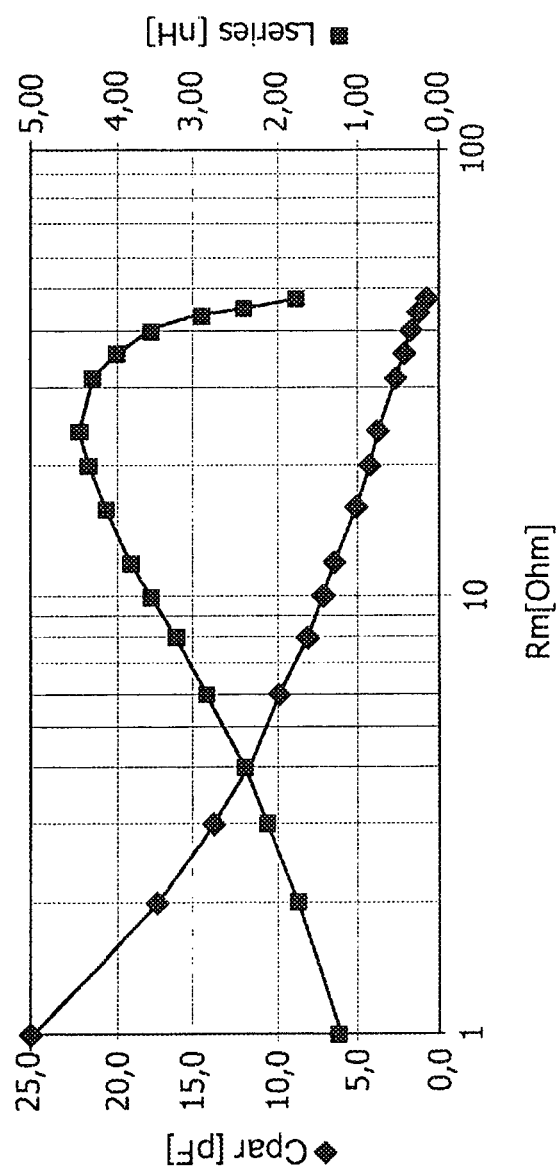

Accordingly, for a single L-network a real load impedance $R_{load}$ can be matched to a lower real matched impedance $R_m$ when the reactances XL and XC obey the equations (1) and (2):

$$X_L = R_m \cdot Q_l \quad (1)$$
and
$$X_C = \frac{R_{load}}{Q_l} \quad (2)$$

in which the loaded quality-factor Q of the network $Q_l$ is given by equation (3):

$$Q_l = \sqrt{\frac{R_{load}}{R_m} - 1}, \quad (3)$$

showing that the loaded-Q is proportional to the square root of the impedance transformation ratio $R_{load}/R_m$ when this ratio is much larger than one. FIGS. 5b and 5c show this for typical values for $R_{load}$ with 50Ω and a frequency about f=900 MHz.

Figure 5D:
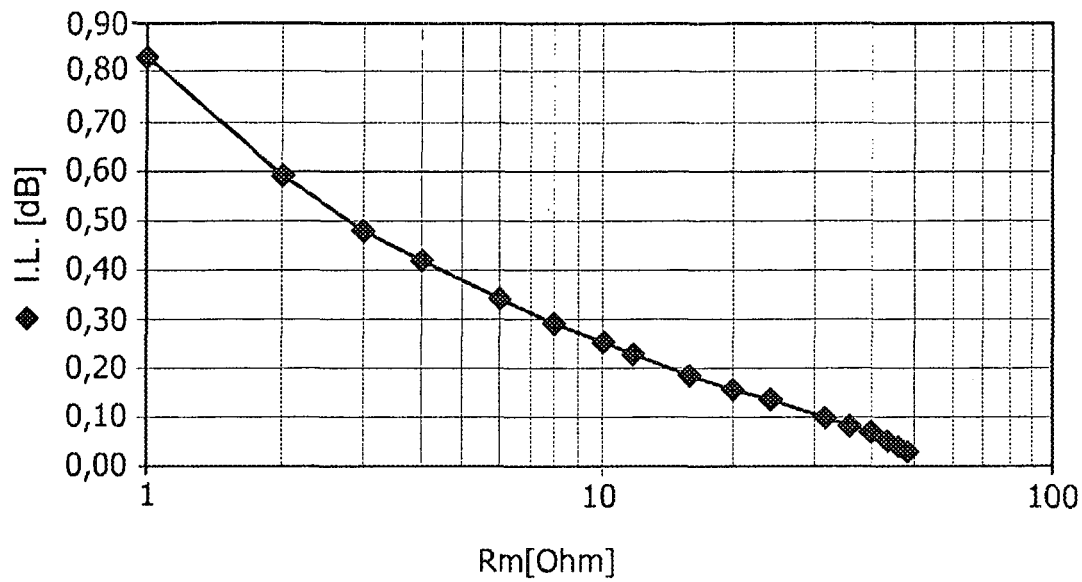

FIG. 5b illustrates the loaded quality-factor Q as a function of the matched impedance $R_m$, wherein $R_{load}$ is assumed as 50Ω and the frequency about f=900 MHz. FIG. 5c depicts the component values of the circuit elements $C_{par}$ (left axis of FIG. 5c) and $L_{series}$ (right axis of FIG. 5d) as a function of $R_m$, wherein it is assumed that $R_{load}$ is 50Ω, the frequency is f=900 MHz, Q-factor of the inductor $Q_{Lseries}$ is 50, and Q-factor of the capacitor $Q_{Cpar}$ is 100. Here it is to be noted that unlike the capacitor $C_{par}$, the series inductor $L_{series}$ has a maximum beyond which its value reduces rapidly when $R_m$ approaches 50Ω. A substitution of equation (3) into equation (1) yields:

$$X_L = \sqrt{R_m \cdot R_{load} - R_m^2} \quad (4)$$

which has a maximum when:

$$\frac{\partial X_L}{\partial R_m} = 0, \quad (5)$$

This holds true for:

$$R_m = \frac{1}{2} R_{load} \quad (6)$$

and gives:

$$X_L = \frac{1}{2} R_{load}. \quad (7)$$

Thus, the tuneable series reactance $X_L$ has a maximum of ½ $R_{load}$ for $R_m$ equals ½ $R_{load}$. Due to the low loaded quality-factor Q this maximum is rather wide. Therefore, a 50Ω load can be matched rather accurately from approximately 40 to 10Ω even without tuning the series inductor. When the impedance tuning range has to be extended to a range of 40 to 2Ω, the inductor maximum-to-minimum ratio needs to be 2.5.

The L-network insertion loss IL can be expressed as:

$$IL = 10 \cdot \log\left(1 + Q_l \cdot \frac{Q_C + Q_L}{Q_C \cdot Q_L}\right) \quad (8)$$

in which $Q_L$ and $Q_C$ are the quality factors Q (or Q-factor for short) of the coil (inductor) $L_{series}$ and capacitor $C_{par}$ respectively. This equation shows that the insertion loss is proportional to the loaded Q-factor and to the inverse of the effective component Q-factor ($Q_C \cdot Q_L / Q_C + Q_L$).

For constant component Q-factors the insertion loss increases with the impedance transformation ratio $R_{load}/R_m$. Typical values of the network insertion loss for $R_{load}$ with 50Ω, $Q_L$ being 50, $Q_C$ being 100, and f being around 900 MHz are given in FIG. 5d, which shows that a 50Ω load impedance can even be matched down to 2Ω with an insertion loss of 0.6 dB only.

If, under variable load conditions, the variable matching network has to be tuned from a first matched condition, in which $R_{load1}$ is matched to $R_{m1}$, to a second matched condition, in which $R_{load2}$ is matched to $R_{m2}$, the required capacitor ratio is given by the following equation:

$$\frac{C_1}{C_2} = \frac{R_{load2}}{R_{load1}} \sqrt{\frac{R_{m2}}{R_{m1}} \cdot \frac{R_{load1} - R_{m1}}{R_{load2} - R_{m2}}}. \quad (9)$$

The corresponding inductor ratio is given by the following equation:

$$\frac{L_1}{L_2} = \frac{R_{m1}}{R_{m2}} \sqrt{\frac{R_{m2}}{R_{m1}} \cdot \frac{R_{load1} - R_{m1}}{R_{load2} - R_{m2}}}. \quad (10)$$

Figure 5E:
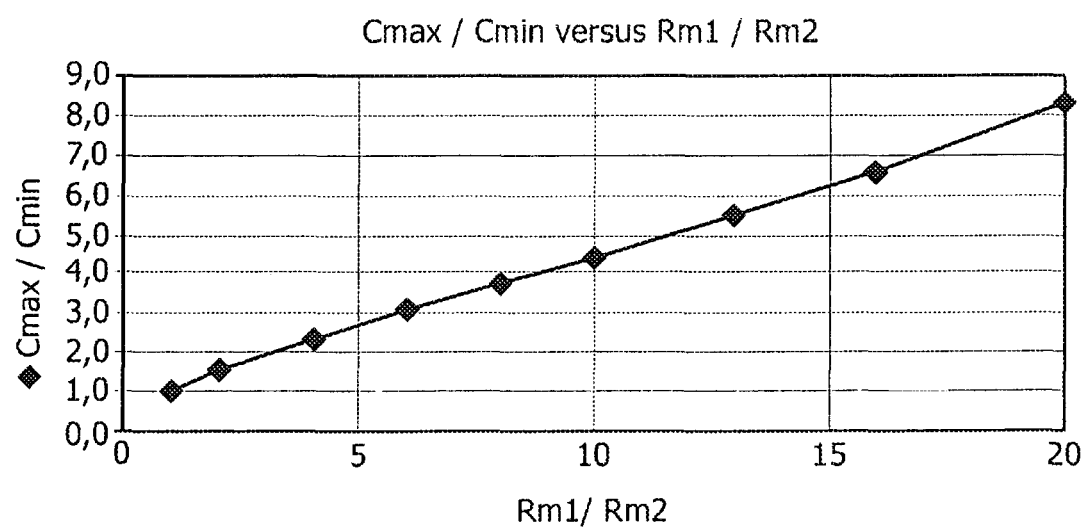

Some typical values for $R_{load1} = R_{load2} = 50\Omega$ are illustrated in FIG. 5e. For instance, from FIG. 5e it can be derived that a 50Ω load impedance can be matched from 2 to 32Ω by changing the parallel capacitance from 2.7 pF to 17 pF, which corresponds to a maximum-to-minimum capacitor ratio of 6.6.

Figure 6A:
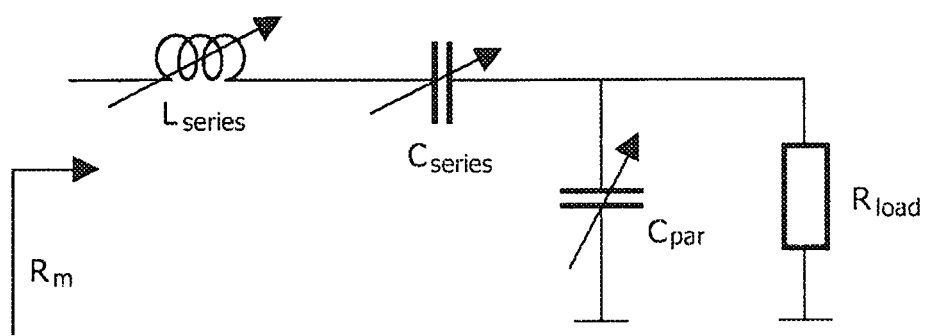
FIGS. 6a-6c illustrate network properties of a second implementation of the variable impedance matching network.

Now a second analysis with respect to the variable impedance matching network will be discussed, where a variable L-network with a fixed series inductor $L_{series}$, a tuneable series capacitor $C_{series}$ and a tuneable parallel capacitor $C_{par}$ will be analyzed as depicted by the schematic circuit diagram in FIG. 6a. This circuit represents the architecture used in the embodiments of FIGS. 2, 3, and 4.

Now, for matching a load impedance $R_{load}$ to a matched impedance $R_m$ the required parallel capacitor reactance $XC_{par}$ can be expressed by equation (11):

$$X_{Cpar} = \frac{R_{load}}{Q_l} \quad (11)$$

in which the loaded Q-factor of the network $Q_l$ is given by equation (12):

$$Q_l = \sqrt{\frac{R_{load}}{R_m} - 1} \quad (12)$$

Equations (11) and (12) are similar to the equations (2) and (3), above, where it was derived that the required series reactance has a maximum of ½ of $R_{load}$. The reactance of the fixed series inductor $L_{series}$ has to be made larger in order to allow for additional negative reactance of the variable capacitor $C_{series}$. Here, it has been found that a good practical choice for the reactance of the fixed series inductor $L_{series}$ is:

$$X_L = R_{load} \quad (13)$$

for which the series capacitor reactance $XC_{series}$ is given by:

$$X_{Cseries} = Q_l R_m - R_{load} \quad (14)$$

Figure 6B:
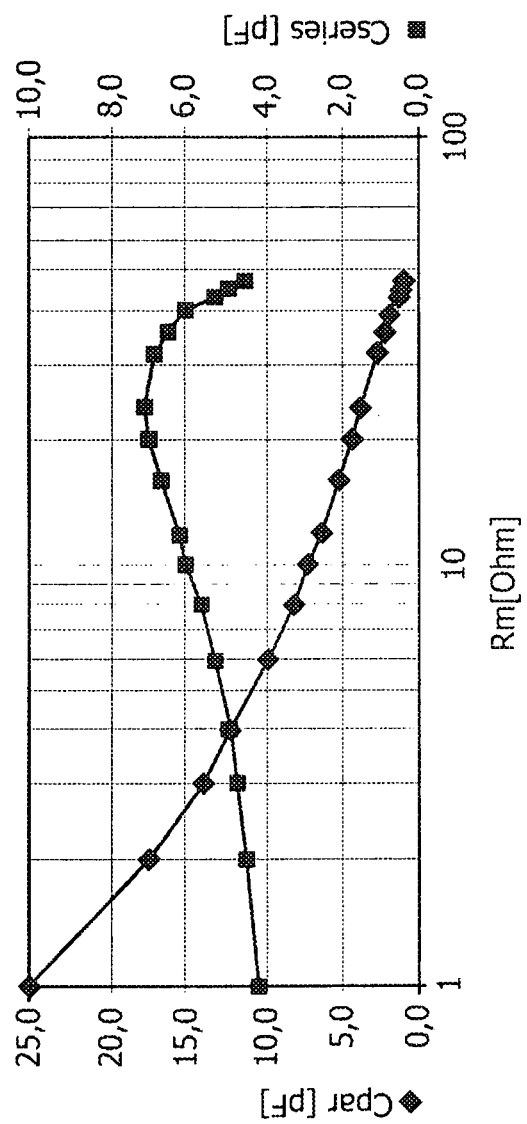

For this condition, some typical figures of parallel capacitor and series capacitor values $C_{par}$ and $C_{series}$ as a function of $R_m$ are given in FIG. 6b where the parallel capacitor values are depicted by diamonds with respect to the left axis of the diagram and the series capacitor values are depicted by squares with respect to the right axis of the diagram as function of the matched impedance $R_m$. $R_{load}$ is assumed as 50Ω, $L_{series}$ as 8.8 nH, and f as 900 MHz.

For this variable impedance matching network with tuneable series capacitor $C_{series}$ the insertion loss IL can be expressed as the sum of the parallel capacitor loss, series capacitor loss and series inductor loss as:

$$IL = IL_{Cpar} + IL_{Cseries} + IL_{Lseries} \quad (15)$$

in which:

$$IL = 10 \cdot \log\left(1 + \frac{Q_l}{Q_{Cpar}}\right) \quad (16)$$

$$IL_{Cseries} = 10 \cdot \log\left(1 + \frac{Q_l^2 + 1 - Q_l}{Q_{Cseries}}\right) \quad (17)$$

$$IL = 10 \cdot \log\left(1 + \frac{Q_l^2 + 1}{Q_{Ls}}\right) \quad (18)$$

Figure 6C:
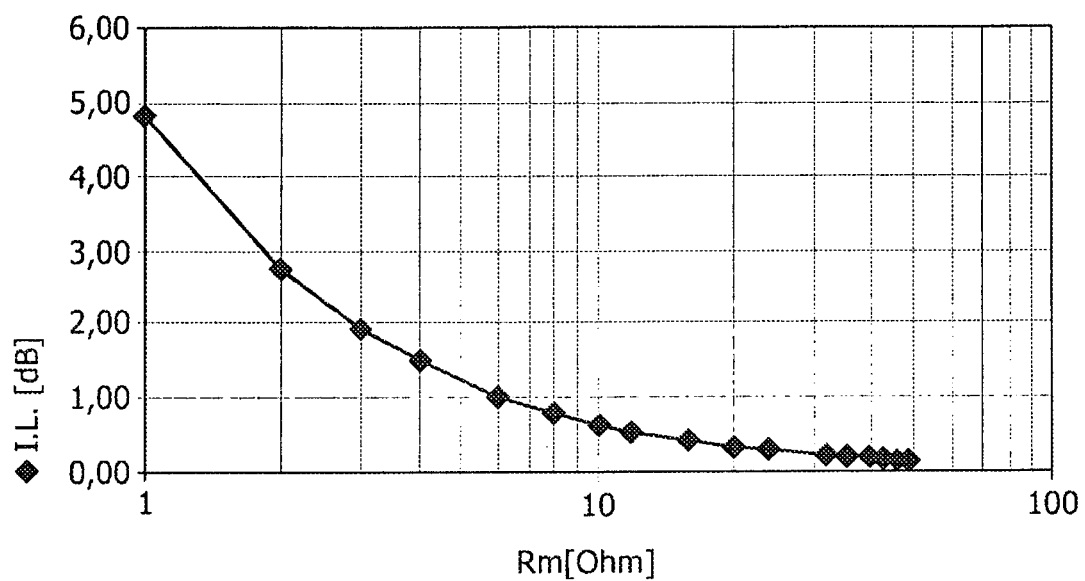

It is noted that the losses in the series branch are proportional with the square of the loaded Q-factor. Therefore, losses in the series branch typically dominate the losses in the parallel branch, especially when the loaded Q-factor is high, as can be derived from FIG. 6c, which shows, for instance, that matching of a 50Ω load to 2Ω results in 2.8 dB insertion loss when $Q_{Lseries}$ is 50, and $Q_{Cpar}$ is 100.

This is very high for a typical power amplifier application in which very demanding efficiency specifications have to be met at maximum output power. The main cause of the relative high insertion loss is the need for a relative large series inductor (in combination with the variable series capacitor), which has a corresponding large series loss impedance, in order to be able to match to high values of $R_m$. This results in a high loaded Q-factor when a match is to be made to low $R_m$ values. However, an improved trade-off between impedance tuning range and insertion loss has been found by use of two or more switched inductors, which are combined with the variable series capacitor.

Now, some analysis with respect to the required fixed impedance inverting network (or impedance inverter for short) will be provided. The fixed impedance inverter can be used to transform a real load impedance $R_{load}$ into a real matched impedance $R_m$ over a wide impedance range. The transfer function of an ideal impedance inverter is given by equation (19).

$$R_m = \frac{Z_0^2}{R_{load}} \quad (19)$$

Figure 7A:
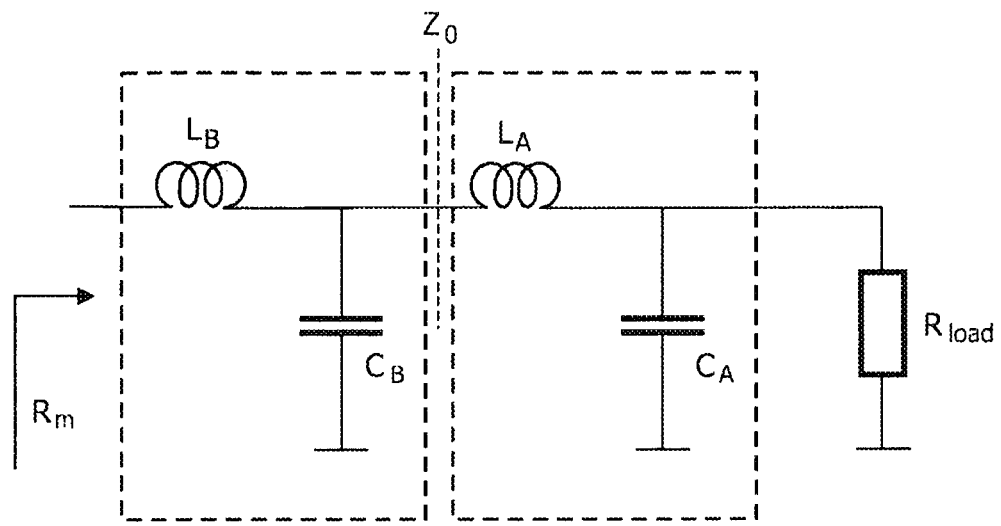
FIGS. 7a, 7b illustrate network properties of the fixed impedance inverting network.
Figure 7B:
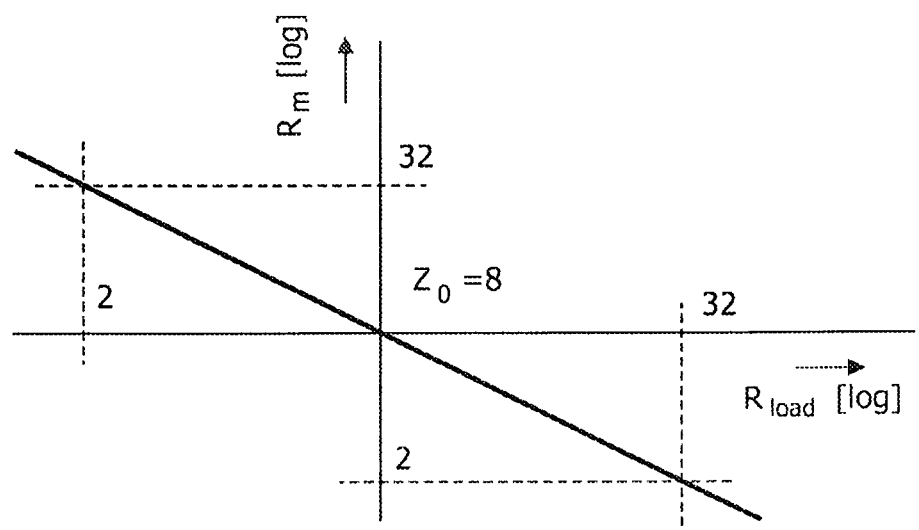

In equation (19) $Z_o$ has a similar meaning as the characteristic impedance of a quarter-lambda (λ/4) micro strip-line. An approximation of this impedance inverter function can be realized by a lumped circuit implementation as is shown in FIG. 7a. The fixed impedance inverting network consists of two cascaded L-networks, of which the loaded Q-factor $Q_{l\_A}$ of a-section A and $Q_{l\_B}$ of a section B are the same. This is expressed by equation (20).

$$Q_{l\_A} = Q_{l\_B} = Q_l, \quad (20)$$

The loaded Q-factor of both network sections A and B Ql is given by equation (21) or similar by equation (22).

$$Q_l = \sqrt{\frac{R_{load}}{Z_0} - 1}, \quad (21)$$

$$Q_l = \sqrt{\frac{Z_0}{R_m} - 1} \quad (22)$$

The respective network design equations can now be expressed by equations (23) to (25).

$$X_{CA} = \frac{R_{load}}{Q_l} \quad (23)$$

$$X_{LA} = Z_0 \cdot Q_l \quad (24)$$

$$X_{CB} = \frac{Z_0}{Q_l} \quad (25)$$

$$X_{LB} = R_m \cdot Q_l \quad (26)$$

Accordingly, the needed inductor and capacitor, respectively, ratios can be expressed by equations (27) and (28).

$$\frac{X_{CB}}{X_{CA}} = \frac{Z_0}{R_{load}} \quad (27)$$

$$\frac{X_{LB}}{X_{LA}} = \frac{R_m}{Z_0} \quad (28)$$

Based on the discussions and findings above, simulations on the load-line adaptation circuit concept have been performed, based on behavioral models for the voltage controlled variable capacitors, the phase detector, the control circuitry, and for the power transistor. The Q-factor of all coils (inductors) has been set to 50 and that of all capacitors, including the two tuneable (switchable) capacitors, has been set to 100.

Figure 8A:
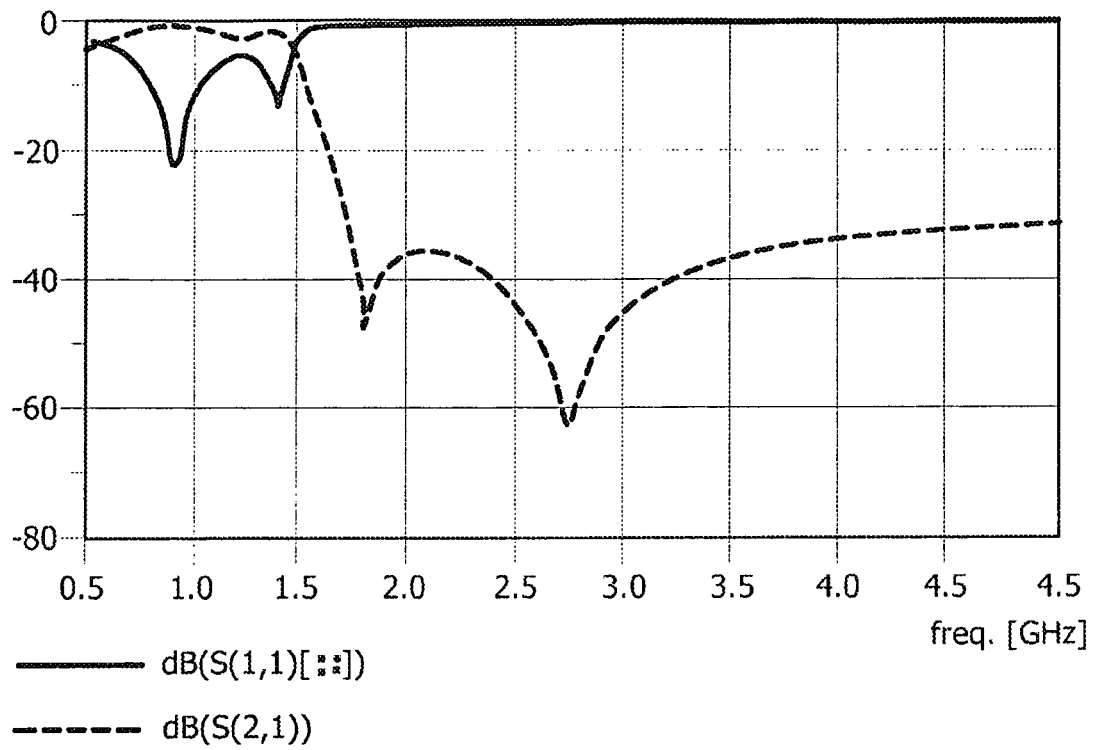
FIGS. 8a-8f illustrate simulation results of the load-line adaptation networks.

Harmonic Balance simulations are performed to verify the impedance transfer functions of the fixed part and variable part of the load-line adaptation circuit. FIG. 8a shows the pass-band of the fixed matching around 900 MHz and transmission zeros at 1800 and 2700 MHz. The input reflection of −20 dBm indicates a proper match to a 2Ω source impedance when it is loaded with 32Ω.

Figure 8B:
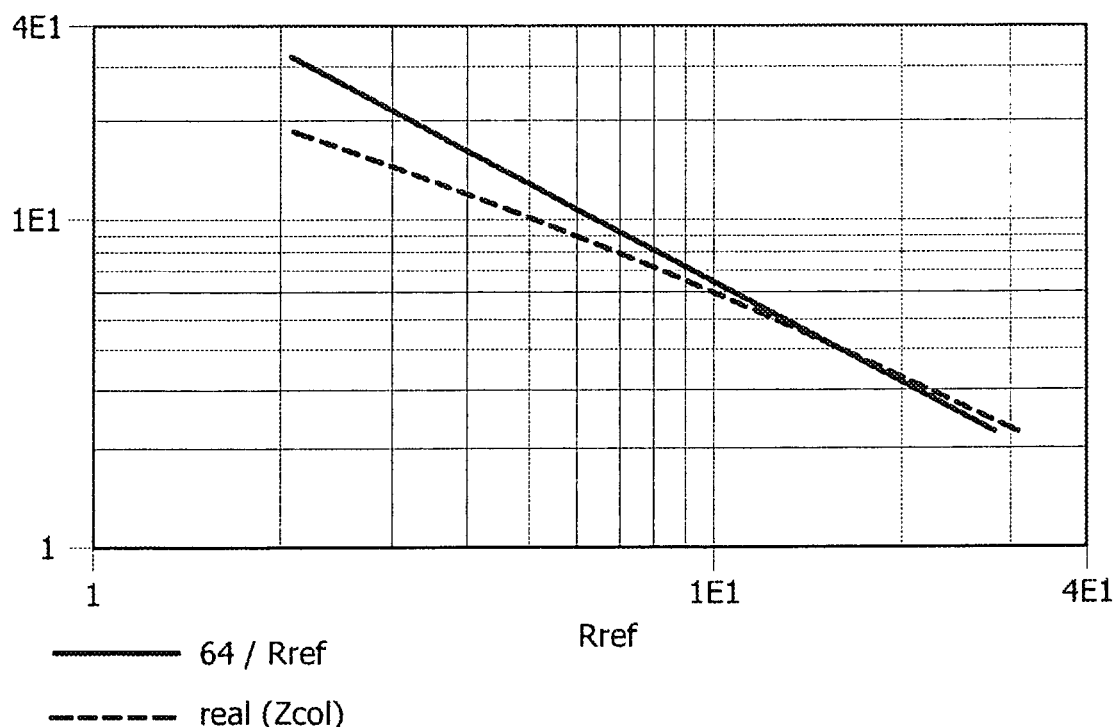

When $R_{Ref}$ is changed from 32Ω down to 2Ω the simulated real part of the adapted power amplifier (PA) output load impedance goes up from approximately 2Ω to almost 20Ω as is shown in FIG. 8b. The dotted line shows the impedance transformation factor that would have been obtained with an ideal circuit.

Figure 8C:
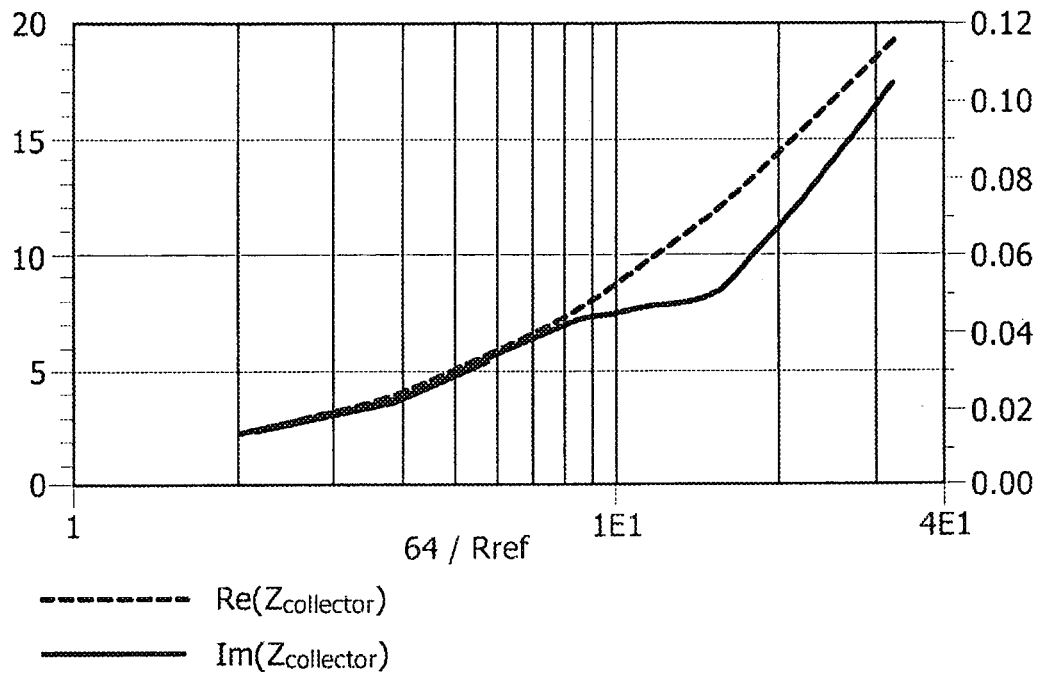
Figure 8D:
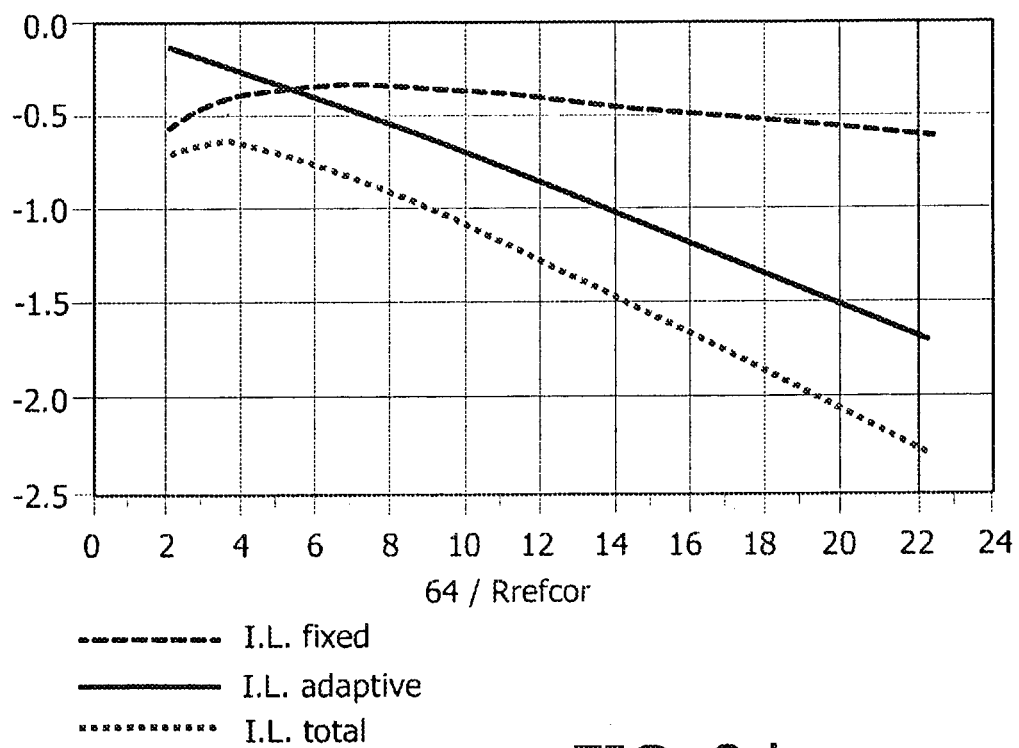

For the entire impedance tuning of $R_{Ref}$, from 2 to 32Ω, the imaginary part of the match impedance is less than 10% of the real part of the matched impedance, which is depicted on the right-hand-side Y-axis of FIG. 8c, which indicates that the real-to-real impedance inverting network transforms accurately In FIG. 8d, simulated insertion losses of the fixed impedance inverter are shown, wherein the adaptive-L network and their sum is a function of the collector load impedance and $Q_L$ is 50, $Q_C$ is 100, and f is 900 MHz. The insertion losses IL of the fixed network are the upper dotted curve, the adaptive match corresponds to the solid curve in the middle and the sum of the two is the lower dashed curve. Obviously, the insertion losses of the fixed network are smallest for a matched impedance of 8Ω, because its loaded Q-factor is then smallest. The adaptive match shows relatively small losses for a matched impedance of 2Ω. Consequently, losses will be relatively low at high output power, which is an advantage of this circuit topology. Effectively, the collector load-line can be adapted from 2 to approx. 20Ω without introducing too much insertion losses.

Figure 8E:
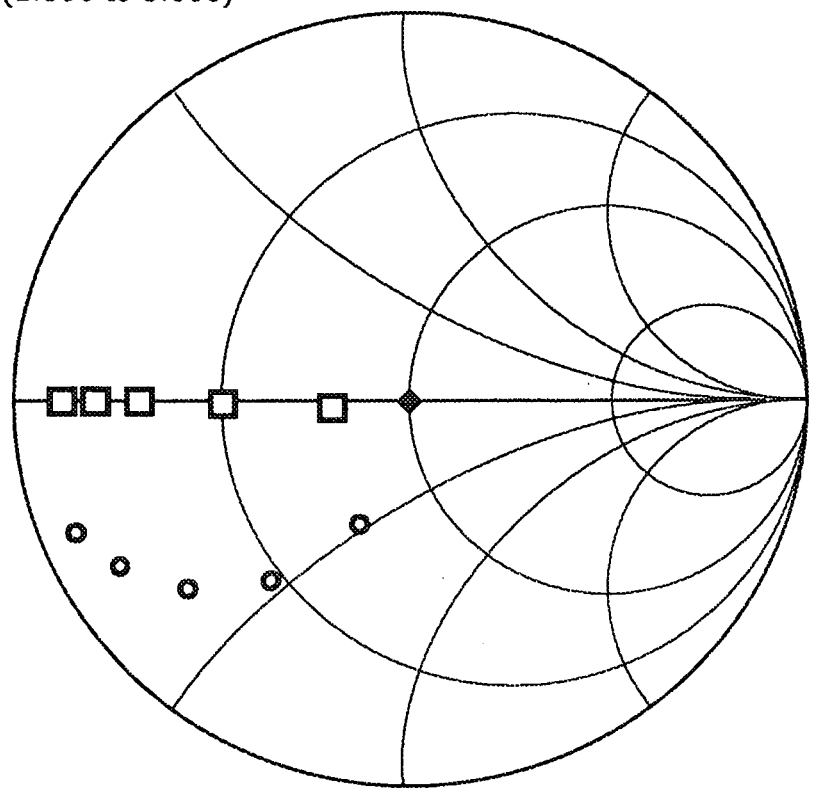

FIG. 8e is a Smith chart, which visualizes the impedance transformation of a 50Ω load over a circle segment of constant admittance (indicated by circles) by $C_{par}$ and the transformation to real impedances (indicated by squares) by $C_{series}$ for $R_{ref}$=2, 4, 8, 16 and 32Ω.

Figure 8F:
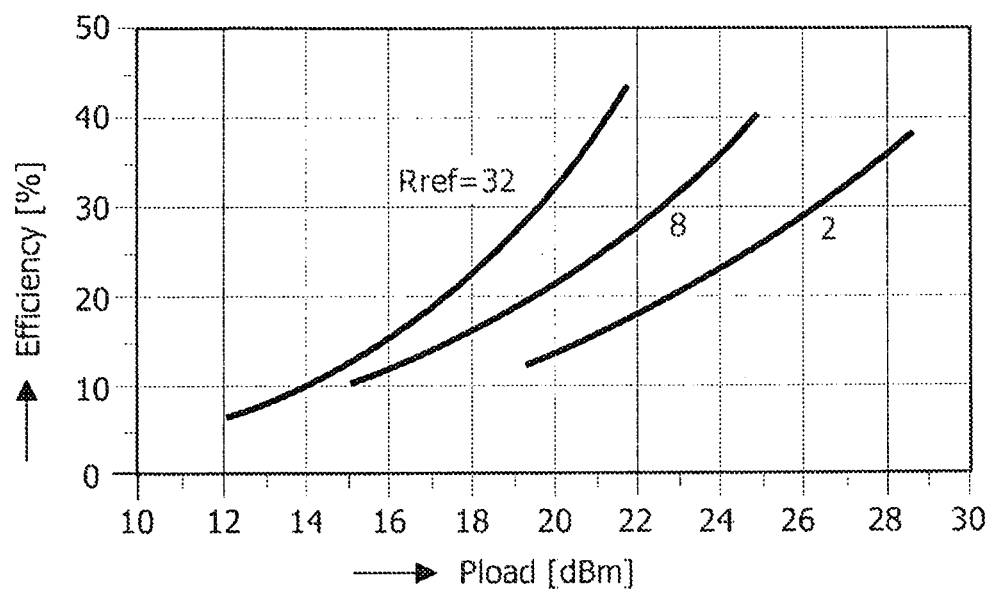

The efficiency of the power transistor connected to a fixed impedance inverting network and followed by an adaptive down-converting L-network has been simulated for reference impedances of 2, 8 and 32Ω with $R_{load}$ being 50 Ω and f being 900 MHz, which is compared in FIG. 8f. For a medium output power of 20 dBm the efficiencies found are 13, 21 and 32% respectively, indicating that, at medium output power levels, impressive efficiency improvements are achievable.

In GSM/EDGE as well as in W-CDMA systems large slot-to-slot output power variations occur. Consequently, fast adaptive control of the load-line is required. Either a feed forward control or a 1-step adaptive control algorithm can be used. A major advantage of the adaptive control is its independence on load impedance variations. W-CDMA operation requires hot-switching, whereas in GSM/EDGE the setting of the variable network can be updated during an idle slot.

To sum it up, the general concept disclosed herein provides a circuit for adaptive matching of a load impedance to a predetermined load-line impedance of a load-line connected to a power amplifier output comprises a fixed matching network between the power transistor and an adaptive matching network, whereby the fixed matching network acts as an impedance inverter which results in a relatively low insertion loss at high power. Results indicate that the impedance inverting network can be used over more than a factor of 10 in impedance variation. Further, the usage of the fixed matching network, close to the power transistor, allows for the implementation of transmission zeros and/or for a well defined load impedance at a predetermined harmonic frequency, independent of the (variable) load impedance at the fundamental frequency.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment wherein switched coils are used to implement a variable inductor. By the availability of a high Q-factor variable inductor the trade-off between tuning range and associated insertion losses can be improved.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A circuit for adaptive matching of a load impedance to a predetermined load-line impedance of a load-line connected to a power amplifier output, the circuit comprising:
    a variable impedance matching network coupled to the load impedance for transformation of the load impedance to a matched impedance, wherein the variable impedance matching network comprises at least one variable circuit element having an impedance that is controllable by a control setting input such that matching by the variable impedance matching network is controllable by a control setting applied to the control setting input; and a fixed impedance inverting network coupled to the variable impedance matching network for transformation of the matched impedance to the predetermined load-line impedance;

wherein the variable impedance matching network is feed forward controlled by a control circuit, the control circuit comprising a look-up table with stored calibration data of the variable impedance matching network, wherein the calibration data is mapped to several different output power levels of the power amplifier.

2. The circuit according to claim 1, wherein the at least one variable circuit element comprises at least two variable circuit elements including a first circuit element coupled in series to the load impedance and a second circuit element coupled in parallel to the load impedance.

3. The circuit according to claim 2, wherein the first and second circuit elements comprise variable capacitors, at least one of the variable capacitors comprising an array of binary weighted switchable parallel connected capacitors wherein the control setting corresponds to a digital code stored in at least one register having a plurality of outputs, each register output being coupled to the switchable parallel capacitors such that each of the variable capacitors is controllable by the respective digital code stored in the respective register output.

4. The circuit according to claim 3, wherein the first circuit element further comprises a variable inductor, wherein the variable inductor comprises an array of switchable parallel connected inductors and wherein the control setting corresponds to a digital code stored in an inductor register having an output coupled to the switchable parallel connected inductors such that the variable inductor is controllable by the digital code stored in the inductor register.

5. The circuit according to claim 1, wherein the circuit is implemented in a transmitter unit of a device for use in one of a Wide Band Code Division Multiple Access system or of a Global Communications System according to a standard providing Enhanced Data rates for Global Evolution.

6. The circuit according to claim 1, wherein the circuit further comprises at least one detector for detecting characteristics of the matched impedance the control circuit being configured to adjust the control setting of the variable impedance matching network in response to the detected characteristics of the matched impedance in accordance to an actual power level.

7. The circuit according to claim 6, wherein the look-up table stores parameter data describing the variable impedance matching network for each control setting, and wherein the control circuit is configured to calculate from the detected characteristics of the matched impedance and the corresponding parameter data of an actual control setting an actual load impedance, and then to calculate from the calculated actual load impedance and the actual output power level a new setting for the variable impedance matching network.

8. The circuit according to claim 7, wherein the parameter data comprises S-parameter data, H-parameter data, Z-parameter data, and/or Y-parameter data.

9. The circuit according to claim 6, wherein the control circuit is configured to update the setting of the variable impedance matching network at predetermined times or upon a predetermined event.

10. The circuit according to claim 6, wherein the control circuit is configured to adjust step-by-step in response to the detected characteristics of the matched impedance of the variable impedance matching network in a predetermined direction until an optimum match is achieved.

11. The circuit according to claim 1, wherein the fixed impedance inverting network provides a well defined load impedance at a predetermined second harmonic frequency, independent of the load impedance at a fundamental frequency.

12. The circuit according to claim 1, wherein the fixed impedance inverting network comprises transmission zeros for rejection of predetermined frequencies.

13. A circuit for adaptive matching of a load impedance to a predetermined load-line impedance of a load-line connected to a power amplifier output, the circuit comprising:

a variable impedance matching network coupled to the load impedance for transformation of the load impedance to a matched impedance, wherein the variable impedance matching network comprises at least one variable circuit element having an impedance that is controllable by a control setting input such that matching by the variable impedance matching network is controllable by a control setting applied to the control setting input; and a fixed impedance inverting network coupled to the variable impedance matching network for transformation of the matched impedance to the predetermined load-line impedance;

wherein the variable impedance matching network is controlled by the control setting such that the matched impedance is set in accordance to a reference impedance Rref, which is calculated according to:

$$R_{ref} = Z_0^2 \cdot \frac{2 \cdot P_{load}}{(U_{supply} - U_{sat})^2},$$

wherein Z0 is a characteristic impedance of the fixed impedance inverting network, Pload is a required output power, Usupply is a supply voltage, and Usat is a collector saturation voltage of the power amplifier.

14. The circuit according to claim 13, wherein the variable impedance matching network is feed forward controlled by a control circuit, the control circuit comprising a look-up table with stored calibration data of the variable impedance matching network, wherein the calibration data is mapped to several different output power levels of the power amplifier.

15. A method of adaptive matching of a load impedance to a predetermined load-line impedance at a power amplifier output, the method comprising:

adjusting a variable impedance matching network for transforming the load impedance to a matched impedance, wherein the adjusting comprises setting an impedance of at least one variable circuit element of the variable impedance matching network; and inverting the matched impedance to a predetermined load-line impedance by a fixed impedance inverting network;

deriving from a look-up table a required setting for the at least one variable circuit element, wherein the look-up table comprises stored calibration data of the variable impedance matching network, the calibration data being mapped to different output power levels of the power amplifier output; and setting the impedance of the at least one variable circuit element by applying the derived setting to the at least one variable circuit element.

16. The method according to claim 15, further comprising updating a setting of the at least one variable circuit element at predetermined times or upon a predetermined event.

17. The method according to claim 15, further comprising detecting at least one characteristic of the matched impedance.

18. The method according to claim 17, further comprising setting the impedance of the at least one variable circuit element in response to the detected at least one characteristic of the matched impedance in accordance with an actual output power level.

19. The method according to claim 17, further comprising:
- deriving from a look-up table, with stored parameter data describing the variable impedance matching network for each applied setting, an actual load impedance in accordance with the detected characteristic of the matched impedance and the corresponding parameter data of an actual setting;
- calculating from the derived actual load impedance and an actual output power level a new setting for the variable impedance matching network; and
- adjusting the setting of the impedance of the at least one variable circuit element by applying the new setting.

20. The method according to claim 17, further comprising adjusting a setting of the at least one variable circuit element step-by-step in a predetermined direction, in response to detecting at least one characteristic of the matched impedance until an optimum match is achieved.

* * * * *